United States Patent [19]

Podowski et al.

[11] 4,006,462
[45] Feb. 1, 1977

[54] DIGITAL REMOTE CONTROL SYSTEM WITH SIGNAL VERIFICATION

[75] Inventors: Robert R. Podowski, Elmhurst; Johnny Collins, Harvey, both of Ill.

[73] Assignee: Zenith Radio Corporation, Chicago, Ill.

[22] Filed: Mar. 10, 1975

[21] Appl. No.: 556,760

[52] U.S. Cl. .................. 340/168 B; 340/146.1 BA; 340/167 A; 340/171 R
[51] Int. Cl.² .................... H04Q 9/16; G06F 11/00
[58] Field of Search ........ 340/168 R, 168 B, 168 S, 340/171 R, 148, 147 P, 167 R, 167 A, 146.1 BA

[56] References Cited
UNITED STATES PATENTS

| | | |
|---|---|---|
| 3,611,297 | 10/1971 | Kramer et al. ............... 340/148 X |
| 3,705,363 | 12/1972 | Okada et al. ............... 340/167 A X |
| 3,836,959 | 9/1974 | Pao et al. ...................... 340/148 |
| 3,852,722 | 12/1974 | Neuville ................... 340/167 A X |
| 3,855,575 | 12/1974 | Leuschner et al. ........... 340/148 X |
| 3,858,116 | 12/1974 | Friedl et al. .............. 340/167 A X |
| 3,944,982 | 3/1976 | Mogi et al. ................... 340/171 R |

*Primary Examiner*—Donald J. Yusko
*Attorney, Agent, or Firm*—Nicholas A. Camasto

[57] ABSTRACT

A wireless remote control system has a transducer coupled to a sampling first counter for counting the frequency of incoming signals. A portion of the count distinguishes among various control signal frequencies and is supplied to a memory and a comparator. A second counter counts the number of identical comparisons of present and immediately preceding measurements, and is reset when a non-identical comparison is detected. The memory supplies the stored portion of the count to a decoder which is disabled by the second counter until a predetermined number of identical frequency comparisons have been determined, which provides noise immunity. The decoder is coupled to utilization means to activate the control function corresponding to the frequency of the control signal.

4 Claims, 1 Drawing Figure

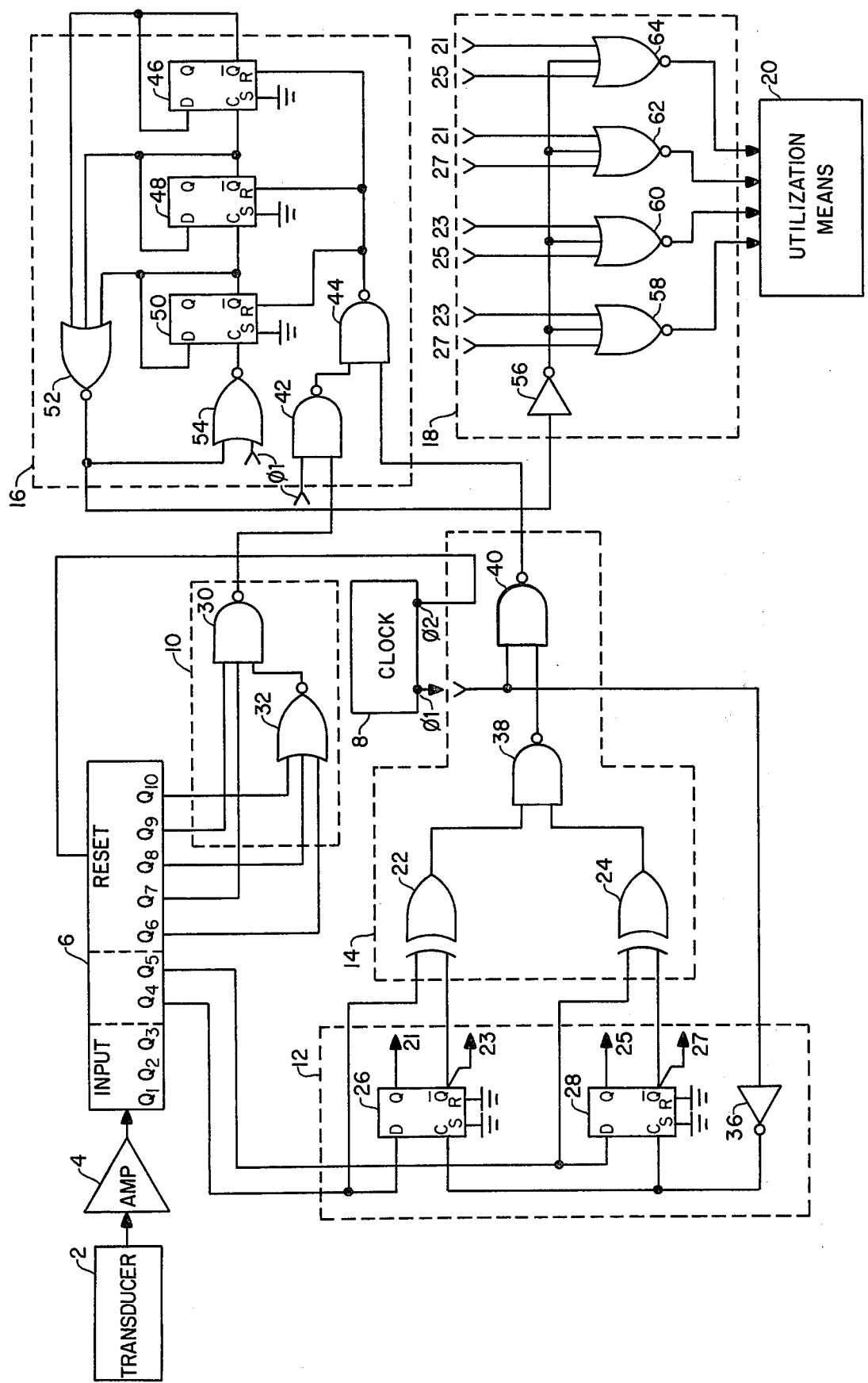

DIGITAL REMOTE CONTROL SYSTEM WITH SIGNAL VERIFICATION

BACKGROUND OF THE INVENTION

The invention is concerned with wireless remote control systems. While the invention is not to be so restricted, it will be discussed in the environment of a wireless remote control system for a television receiver. Such systems normally include a transducer for converting control signals into corresponding electrical signals, decoding circuits for determining which functions has been selected, and utilization circuits for performing the selected function. Various forms of noise immunity circuits are also included to enable such systems to distinguish between intentionally generated control signals and spurious signals.

Ultrasonic remote control systems have for years been a polular control medium for television receivers. A typical system consists of a viewer actuated transmitter for producing ultrasonic control signals at discrete frequencies and a remote receiver in the television set for receiving and decoding the control signals. The transmitter may be either electronic, and include an oscillator, or mechanical and employ rods of selected length and material which, when mechanically struck, produce distinctive ultrasonic frequencies corresponding to the selected function. A transducer in the receiver converts received ultrasonic information into corresponding electrical information which is supplied to a series of resonant circuits, each responsive to a particular one of the ultrasonic control signal frequencies. The resonant circuits thus determine which control signal has been received and activated appropriate utilization circuits in the television receiver.

In the ultrasonic region, noise produced, for example, by the jingling of keys or dropping of coins on hard surfaces may cause false actuation of individual functions of the television receiver. Recognizing that control signals and noise are distinguishable on the basis of amplitude and duration, a common form of noise immunization used R-C networks for integrating the relatively long duration control signals. Noise or other short duration signals were generally incapable of actuating the utilization devices. Another form used noise information to reverse bias the remote amplifier, and in effect, preclude operation in the presence of noise.

The resonant circuits for determining the control signals generally incorporated inductors. In the natural development of the art, the vacuum tubes used in the remote amplifiers were supplanted by transistors. Recently major portions of the television receiver circuitry are being fabricated in integrated circuit form, which has attractive space, cost and reliability advantages. The discrete inductors and (to a more limited extent) capacitors in the tuned circuits of the prior art remote receivers do not facilitate the integrated circuit form.

U.S. Pat. No. 3,611,297 to Kramer describes one system, which may be suitable for fabrication in an integrated circuit employing digital techniques. A clock is coupled to counters which sample an incoming signal to determine its frequency. Similar to the above mentioned prior art systems, noise immunity is achieved by a detector and noise suppressor circuit which requires that a valid control signal have a constant amplitude for some fixed period of time. The output of the detector and noise suppressor is coupled through a pulse shaper to a clock controlled frequency counter.

The counter uses a multi-stage counting technique with each stage dividing down the number of pulses to be counted by the succeeding stages. It appears that the least sensitive stages are ignored, the intermediate stages correspond to individual control functions and the most significant counter stages correspond to the proper range for the received frequency. The control function is activated only when the last stages detect the proper range and the intermediate stages decode one of the selectable functions. It is not clear from the Kramer disclosure how the circuit for noise detection operates. Apparently, the noise circuitry relies on the assumption that noise can be distinguished from control signals because of the former's randomly varying amplitude. The specification indicates that a noise suppressor circuit feeds a signal to circuitry for disabling the functioning of the counters during noise conditions. Thus, rather than distinguish between signal and noise, the system will shut down during reception of any varying amplitude signal even though it be a valid control signal. Thus, movement of the transmitter may cause misinterpretation of a valid control signal, for example, by waving the transmitter while producing a control frequency. Further, in the Kramer system the integrator in the noise suppressor operates on whatever signals are received and is incapable of distinguishing separate signals. It decodes whatever frequency signal is received and assumes that that frequency was present during the entire integration period. Simultaneously producing two or more frequencies or even a single frequency and a noise burst could confuse the system. The invention resolves these and other problems of the prior art by verifying a signal before decoding to activate the corresponding control function.

Objects of the Invention

An object of this invention is to provide a novel remote control system.

Another object of this invention is to provide an improved remote control system of enhanced noise immunity.

Summary of the Invention

In accordance with the invention a control device is operable by received control signals having predetermined duration characteristics and predetermined individual frequency characteristics for selectively activating a plurality of utilization means. Verification means are included for verifying that the received signals have the predetermined duration characteristics by repetitively sampling and determining the presence of the predetermined individual frequency characteristics. Decoding means are coupled between the verification means and the utilization means for selectively activating the utilization means in accordance with the individual characteristics in response to a predetermined number of verified samples.

BRIEF DESCRIPTION OF THE DRAWING

The single FIGURE shows the detailed circuitry of the preferred embodiment of the invention with functional segments enclosed by broken lines. For simplicity, only logic connections are shown in the FIGURE without connections to voltage sources. Positive logic is used throughout and logic gates are simply referred to by their functional names, i.e., NAND, EXCLUSIVE OR and NOR, without the word "gate." A 1 represents a high logic (or signal voltage) level and a 0 corresponds to a low logic level. All binary representations are arranged in ascending powers of 2 from left to right to correspond to the terminal arrangement of the binary counters.

The term "input" and "output" generally indicate the device terminal unless signal is specified. The term "inhibit" indicates the condition in which a gate output is no longer dependent upon signals applied to its remaining inputs. The term "enable" designates the condition in which a gate output is dependent upon the signals applied to the remaining inputs.

DESCRIPTION OF THE PREFERRED EMBODIMENT

Referring to the drawing for a general description of the function of the circuit, a transducer 2 converts received signals, such as acoustic signals in an ultrasonic frequency range, into corresponding electrical signals of the same frequency. The control signals have individual characteristics, namely their frequencies, and, as will be seen, a common characteristic of persistence for a minimum duration. An amplifier 4 is coupled between transducer 2 and a 10 stage binary counter 6 for providing properly shaped and amplified pulses for counting. Counter 6 samples, under the control of clock 8, the incoming signal to determine its frequency, and is connected to a range detection circuit 10. As mentioned, frequency is the individual characteristic by which the various control signals are distinguished. Confidence counter 16 is responsive to range circuit 10 and resets when an out-of-range count is detected.

Counter 6 is coupled directly to a storage circuit 12 and a comparator 14. A portion of the frequency count is compared with the immediately preceding count portion (a reference) and stored. The output of storage circuit 12 is also coupled to comparator 14 which, in turn, is coupled to confidence counter 16. Comparisons which show identity between present and previous count portions permit counter 16 to advance without resetting, whereas detection of a non-identity condition causes counter 16 to reset. Clock 8 is coupled to counter 6, storage circuit 12, comparator 14 and confidence counter 16 to provide an appropriate operational timing sequence. Storage circuitry 12 and confidence counter 16 are independently coupled to a decoder 18. When confidence counter 16 has been advanced to a predetermined count, decoder 18 is enabled to decode the stored count portion and supply an appropriate signal to a plurality of utilization means 20 for activation of the selected control function.

Continuing in greater detail, counting by the first three stages of counter 6 is ignored, allowing a range of frequencies to designate individual control functions. This may be easily explained by analogy to the operation of a simple two digit decimal counter. By ignoring the units digits and monitoring only the tens digit, ranges will be detected. Thus, the tens digit will be 0 in the range of 0 to 9, 1 in the range of 10 to 19, etc. The 2 terminal of clock 8 is connected to the reset terminal of counter 6. The Q6, Q8 and Q10 terminals of counter 6 are connected to inputs of a NOR 32 whose output is coupled to one input of a NAND 30. The Q7 and Q9 terminals of counter 6 are connected to the second and third inputs of NAND 30. As indicated by the enclosing broken line, NOR 32 and NAND 30 comprise range detection circuit 10.

The Q4 terminal of counter 6 is connected to one input of an EXCLUSIVE OR 22 and to the D terminal of a data flip-flop 26. The Q5 terminal of counter 6 is coupled to one input of an EXCLUSIVE OR 24 and to the D terminal of a data flip-flop 28. EXCLUSIVE a form of logic gate which produce a 0 logic level signal at its output whenever both inputs are at the same logic level and a 1 logic level signal output otherwise. The Ø1 terminal of clock 8 is connected through an inverter 36 to the C terminals of flip-flops 26 and 28. For convenience, the Q and $\overline{Q}$ terminals of flip-flops 26 and 28 are labelled 21, 23, 25 and 27, respectively. As indicated by the enclosing broken line, flip-flops 26 and 28 and inverter 36, comprise storage circuit 12.

The R and S terminals of both flip-flops 26 and 28 are connected to ground. The $\overline{Q}$ terminal of flip-flop 26 is connected to the second input of EXCLUSIVE OR 22 and the $\overline{Q}$ terminal of flip-flop 28 is connected to the second input of EXCLUSIVE OR 24. The outputs of EXCLUSIVE OR's 22 and 24 are connected to the inputs of a NAND 38 whose output is connected to the second input of NAND 40. The Ø1 terminal of clock 8 is connected to the second input of NAND 40. As indicated by the broken line, EXCLUSIVE OR's 22 and 24 and NAND's 38 and 40 comprise comparator 14.

The Ø1 terminal of clock 8 is connected to one input of NAND 42 and the output of NAND 30 is connected to the second input of NAND 42. The output of NAND 42 is connected to one input of NAND 44 and the output of NAND 40 is connected to the second input of NAND 44. As indicated by the broken line, flip-flops 46, 48 and 50, NOR's 52 and 54 and NAND's 42 and 44 comprise confidence counter 16. The output of NAND 44 is coupled to the R terminals of each of flip-flops 46, 48 and 50, the S terminals of which are connected to ground. The $\overline{Q}$ terminal of flip-flop 50 is connected to the C terminal of flip-flop 48 and the $\overline{Q}$ terminal of flip-flop 48 is coupled to the C terminal of flip-flop 46. The Q and the D terminals of each of flip-flops 46, 48 and 50 are connected to the three inputs of a NOR 52. The output of NOR 52 is connected to an input of NOR 54. The Ø1 terminal of clock 8 is connected to the second input of NOR 54 and the output of NOR 54 is connected to the C terminal of flip-flop 50.

As indicated by the broken line, decoder 18 comprises an inverter 56 coupled to one input each of a plurality of NOR's 58, 60, 62 and 64. The output of NOR 52 is connected to inverter 56. Storage circuitry 12 is coupled to decoder 18 in the following manner: terminals 21 and 25 are connected to the second and third inputs of NOR 64; terminals 21 and 27 are connected to the second and third inputs of NOR 62; terminals 23 and 25 are connected to the second and third inputs of NOR 60; and terminals 23 and 27 are connected to the second and third inputs of NOR 58. The output terminals of NOR's 58, 60, 62 and 64 will maintain logic levels which activate utilization means corresponding to the various controlled functions.

Utilization means 20 is shown in a separate block and comprises the circuitry and apparatus (not illustrated) for actuating the controlled functions. As an example, the output of any NOR of decoder 18 may be coupled to a binary counter in combination with a digital to analog converter and a varistor. The signal from the NOR would advance the counter and produce a progressively increasing voltage to which the varistor would respond by adjusting the selected function, such as the volume level of a television receiver. Additional NOR's may be connected to single flip-flops for providing off-on action of various control functions or may be connected to a stepper motor for providing more complicated functions, such as tuning the television receiver. Such voltage responsive control techniques are well-known to those skilled in the art and are not a part of this invention.

The timing sequence for the control unit is determined by clock 8. Clock 8 may be operated from the power line to which the television receiver or control unit is connected. The timing signal at the 01 clock terminal is a short duration (approximately 2 microseconds long) positive rectangular pulse of a 1 logic level which occurs every 8.33 ms. (millisecond). The timing signal at the 02 terminal is approximately a 2 microsecond rectangular pulse of a 1 logic level whose positive going leading edge corresponds to the occurrence of the trailing edge of a 01 pulse. The 02 pulse is used exclusively to reset counter 6 for the next sampling period. The 1 level portion of the 01 pulse establishes the comparison interval and produces a reset signal for confidence counter 16 during non-identity of a comparison or ducing an out-of-range condition. Because the clock terminals of the date flip-flops respond to edge triggering, data is transferred to storage circuit 12 and confidence counter 16 is advanced, after an identity comparison, during occurrence of the trailing edge of a 01 pulse.

Counter 6 is a continuously operating ten stage binary ripple counter which is reset to zero every 8.33 ms. It counts the frequency of the incoming signals to determine if they are control signals. There are many other forms of signal encoding which may be used to differentiate between control signals. Pulses arranged in a distinctive pattern is one example. For frequency differences, the sampling counter, storage circuit and comparator represent signal pattern recognition means. The counter supplies information to storage circuit 12, comparator 14 and range detection circuit 10. The output signals from range detection circuit 10 and from comparator 14 are combined and confidence counter 16 is reset whenever a non-identity or out-of-range condition occurs. As will be described later the reset may be made to occur with any predetermined number of non-identity determinations but in the preferred embodiment reset is performed upon one such detection.

Confidence counter 16 is a 3 stage binary counter initially established, by a reset pulse from NAND 44, at a 111 state (decimal 7) as determined by the logic levels on the $\overline{Q}$ terminals. Each in-range identity comparison permits the confidence counter to be clocked by the 01 timing pulses through NOR 54 to count down without being reset until it reaches a 000 state, indicating that the received signal is properly verified as additionally possessing the proper duration (predetermined common characteristic) of a control signal. If either an out-of-range or non-identity condition is detected, confidence counter 16 is reset to the 111 state to again begin counting down by the 01 timing pulses. When verification has been made the NOR gate which corresponds to the particular control signal frequency is enabled to control utilization means for activating the corresponding control function.

To aid in understanding the operation of the circuit, assume that the control signals are square waves having four ultrasonic frequency ranges A, B, C and D comprising 38.4 to 39.24 KHz, 39.36 to 40.20 KHz, 40.32 to 41.16 KHz and 41.28 to 42.12 KHz corresponding to four television control functions respectively. The short duration 01 and 02 timing pulses may occur any time during detection of the relatively long period of the control signals without substantially disturbing the counting of counter 6. In the 8.33 ms. counting interval, the frequencies in the above ranges correspond to decimal counts of 320–327, 328–335, 336–343 and 344–351 respectively. For frequency range A, the 10 stage counter will read (binary counter notation) XXX0001010. For range b the counter will read XXX1001010. In the C and D ranges, the Q4 and Q5 terminals are respectively 01 and 11, and the Q6 through Q10 terminals will remain at 01010. The output of NOR 32 is at 1 for Q6 and Q8 and Q10 at 0. This output signal level is combined with Q7 and Q9 1 level output signals to produce a 0 level output signal from NAND 30, which indicates the detected signal frequency is in the proper range.

EXCLUSIVE OR 22 compares the signal at the $\overline{Q}$ terminal of flip-flop 26 (which is the inversion of the previous Q4 output signal level of counter 6) with the present Q4 signal level. If its inputs are at different signal levels, the output of the EXCLUSIVE OR is at 1, indicating identity between the present and previous Q4 signal levels. Similarly, EXCLUSIVE OR 24 compares the signal level on the Q5 terminal with the inversion of the previous Q5 signal present at the $\overline{Q}$ terminal of flip-flop 28. Again, if the inputs are different, the output of EXCLUSIVE OR 24 is at 1 indicating identity between the present and previous Q5 signal levels. For an identity between the previous and present signal levels of both Q4 and Q5, the inputs of NAND 38 are at 1 and its output is at 0. Thus, one input of NAND 40 is at 0 as long as there is identity in the comparator. During a 01 timing pulse the second input of NAND 40 is at 1 and its output remains at 1. If, however, the output of NAND 38 is at 1, indicating a non-identity, the output of NAND 40 assumes a 0 level for the 01 pulse duration. The signal from range detector 10 (represented by the output of NAND 30) is combined with a 01 pulse in NAND 42 whose output is combined with the output of comparator 14 (represented by the output of NAND 40) in NAND 44.

Assume an in-range count (NAND 30 is at 0), and an identity indication in the comparator (NAND 40 is at 1). The output of NAND 42 is at 1 and correspondingly the output of NAND 44 is at 0. Thus, no resetting of flip-flops 46 through 50 occurs. The confidence counter counts down with each 01 pulse (corresponding to a simultaneous identity comparison and an "in-range" condition) to indicate an increased level of confidence. Confidence counter 16 comprises 3 DATA flip-flops arranged to form a simple 3 stage resettable binary counter having the $\overline{Q}$ terminals connected to the D terminals to insure the sequence of alternate states. Counting continues during subsequent 01 counting intervals until full confidence is reached (verification of a control signal has been made). Except for a simultaneous in-range count and an identity comparison, a reset pulse is supplied to confidence counter 16 which forces the establishment of a 111 state.

The storage, comparison and confidence counting operations are performed according to a fixed timing sequence. Assume initially that terminals 21 and 25 of storage flip-flops 26 and 28 respectively are at 0 and that counter 6 has just been reset by a 02 pulse to begin a new counting interval. As counting proceeds, the Q4 and Q5 terminals continuously supply signals to the D terminals of flip-flops 26 and 28, respectively, as well as to EXCLUSIVE OR's 22 and 24 in the comparator circuit. The comparator output normally indicates identity through NAND 40. For a non-identity the output of NAND 40 goes to a 0 level signal during the 01 timing pulse.

Assume now that an out-of-frequency range signal is received, but that during the 01 timing pulse the D terminals of flip-flops 26 and 28 remain at 0. The comparator indicates identity but the range detection circuit indicates an out-of-range condition as evidenced by a one level output signal at NAND 30 since the Q6–Q10 terminals are not at 01010, respectively. Because of the out-of-range condition, during the 01 pulse the output of NAND 42 goes to 0 and the output of NAND 44 goes to 1, which resets flip-flops 46, 48 and 50 to re-establish a 111 state in confidence counter 16. With the three inputs of NOR 52 at 1 its output is at 1. This signal level is combined with a 01 timing pulse in NOR 54, whose output goes to 0 pulse duration.

The C terminals of the DATA flip-flops employed in this circuit are responsive to positive going edges of rectangular pulses. The trailing or positive going edge of the pulse at the output of NOR 54 is employed to clock the confidence counter through the C terminal of flip-flop 50 to advance it to its next state, indicating that an identity had been detected in the comparator. The sequence of resetting to a 111 state and clocking occurs at the confidence counter during the detection of non-control frequencies.

The 01 terminal of clock 8 is coupled to inverter 36, whose output is normally at 1 but goes to 0 for the duration of the 01 pulse, and is used to clock the C terminals of flip-flops 26 and 28. When these storage flip-flops are clocked, the signal levels on their D terminals are transferred to their Q terminals. If, for example, during the next counting interval Q4 and Q5 go to 1, and correspondingly the D terminals of flip-flops 26 and 28, then at the end of the next 01 timing pulse the new data will be stored in the flip-flop. Thus, with each succeeding 01 timing pulse a comparison is made and, at the end of the comparison, the storage flip-flops are clocked so that the Q terminals maintain the last previous Q4 and Q5 signal levels.

Flip-flops 46 through 50 count the number of 01 pulses, for which simultaneous identity comparisons and in-range conditions have been determined, by advancing at the end of each 01 pulse duration until a 000 state is reached. This verifies that a control signal has been received. Verification thus comprises a predetermined number of repetitive occurrences of identity comparisons for in-range frequencies. Obviously, rather than in-range frequencies, even greater noise immunity can be readily achieved by only responding to exact frequencies of the control signals, or to restricted ranges of such frequencies. When verification occurs the output of NOR 52 goes to 1 and inhibits the further operation of NOR 54 preventing further change in confidence counter 16.

When confidence has been achieved the 1 level at the output of NOR 52 is inverted by inverter 56 to a 0 level which enables NOR's 58 to 64. It should be noted that until verification is achieved the entire decoding arrangement of NOR's is disabled. Each NOR corresponds to a different combination of signal levels at the Q4 and Q5 terminals of counter 6, which, because of the ignoring of the first three counter stages, corresponds to a frequency range. In particular, NOR 64 corresponds to range A, NOR 60 to range B, NOR 62 to range C and NOR 58 to range D. A verified control signal in the selected frequency range causes the second two inputs of the corresponding NOR gate to be at zero thus providing a 1 level output lasting until confidence counter 16 is reset. Thus, the function may be activated as long as the control signal is received. Although not shown, a simple flip-flop dividing arrangement may be combined with the output of NAND 40 to provide for maintaining the operation of the circuit during non-identity and out-of-range conditions. This would maintain the 1 level signal at the output of NAND 40 until a predetermined number non-confidence conditions had been detected. Rather than resetting the confidence counter immediately upon detection of a non-identity comparison the inclusion of a flip-flop divider would produce a verification range having both an upper confidence count, derived from the maximum permissible count on the confidence counter 16, and a lower confidence count dependent upon the number of dividing flip-flops added to the circuit.

What has been shown is a novel remote control system which enhanced noise immunity. For control signals dependent upon frequency it repetitively measures the frequency to verify that a control signal has been received. Verification includes repetitive confirming measurements of the constancy of the frequency of the received signal. A predetermined number of consistent measurements must be detected before the received signal is verified and decoded and the corresponding function activated.

While particular embodiments of the invention have been shown and described, it will be obvious to those skilled in the art that changes and modifications may be made thereto without departing from the invention in its broader aspects and, therefore, the aim in the appended claims is to cover all such changes and modifications as fall within the true spirit and scope of the invention.

What is claimed is:
1. A control device in which control signals of predetermined minimum duration and predetermined different individual frequencies selectively activate a plurality of utilization means, comprising:
receiving means receiving signals;
verification means coupled to said receiving means for verifying the presence of received signals of said predetermined minimum duration by repetitively sampling and determining the frequency of said signals;
said verification means including a clock controlled first counter for counting the frequency of said received signals, storage means for storing each frequency count, and comparison means for comparing each frequency count with the immediately preceding frequency count; and
decoding means coupled between said verification means and said utilization means and responsive to a first predetermined number of verified samples of said received signal for selectively activating said utilization means in accordance with the frequency of said received signal.

2. The control device of claim 1 wherein said verification means further include a second clock-controlled counter for counting the number of consecutive identical counts.

3. The control device of claim 2 wherein said second clock-controlled counter includes means for disabling said decoding means when said number of consecutive identical counts becomes less than a second predetermined number, said second predetermined number never being greater than said first predetermined number.

4. The control device of claim 3 wherein said second predetermined number is equal to said first predetermined number.

* * * * *